US007750692B2

(12) United States Patent
Mohammadi

(10) Patent No.: US 7,750,692 B2
(45) Date of Patent: Jul. 6, 2010

(54) DIGITAL DIVIDER FOR LOW VOLTAGE LOGEN

(75) Inventor: Behnam Mohammadi, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 61 days.

(21) Appl. No.: 11/963,816

(22) Filed: Dec. 22, 2007

(65) Prior Publication Data

US 2009/0160526 A1 Jun. 25, 2009

(51) Int. Cl.
*H03B 19/00* (2006.01)

(52) U.S. Cl. ....................... 327/115; 327/117; 327/202; 327/218; 331/151; 377/47

(58) Field of Classification Search ......... 327/113–115, 327/117–118, 202, 203, 208, 210, 211, 218; 331/151; 377/47, 48

See application file for complete search history.

(56) References Cited

U.S. PATENT DOCUMENTS 6,693,476 B1 * 2/2004 Lin ............................ 327/203
2008/0180139 A1 * 7/2008 Natonio et al. .............. 327/117

* cited by examiner

*Primary Examiner*—Lincoln Donovan
*Assistant Examiner*—Shikha Goyal
(74) *Attorney, Agent, or Firm*—Garlick Harrison & Markison; Shayne X. Short

(57) ABSTRACT

Digital divider for low voltage LOGEN. LOGEN is a local oscillator generator. One implementation presented herein provides for a pseudo-complementary metal-oxide-semiconductor (CMOS), in that, it is not a true CMOS type circuitry that has no DC current dissipation, but nevertheless does operate well at relatively high frequencies and relatively low power supply voltage levels. Appropriately placed p-channel metal oxide semiconductor field-effect transistors (P-MOSFETs) and n-channel MOSFETs (e.g., N-MOSFETs) are employed to provide for an all digital divider circuitry. In some embodiments, four active circuitry element levels are stacked between a power supply voltage and ground voltage level. In other embodiments, three active circuitry element levels are stacked between a power supply voltage and ground voltage level. The three active circuitry element levels embodiment provides for a greater area savings (e.g., because of the fewer elements) and also provides reduced input capacitance than the four active circuitry element levels embodiment.

10 Claims, 8 Drawing Sheets

DIGITAL DIVIDER FOR LOW VOLTAGE LOGEN

CROSS REFERENCE TO RELATED PATENTS/PATENT APPLICATIONS

Incorporation by Reference

The following related U.S. Utility patent application, being filed concurrently, is hereby incorporated herein by reference in its entirety and is made part of the present U.S. Utility patent application for all purposes:

1. U.S. Utility patent application Ser. No. 11/963,815, entitled "Low voltage LOGEN," filed Dec. 22, 2007, pending.

BACKGROUND OF THE INVENTION

1. Technical Field of the Invention

The invention relates generally to communication systems; and, more particularly, it relates to divider circuitry, such as can be implemented within local oscillator generators (LOGENs), employed within communication devices employed within such communication systems.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), radio frequency identification (RFID), Enhanced Data rates for GSM Evolution (EDGE), General Packet Radio Service (GPRS), and/or variations thereof.

Depending on the type of wireless communication system, a wireless communication device, such as a cellular telephone, two-way radio, personal digital assistant (PDA), personal computer (PC), laptop computer, home entertainment equipment, RFID reader, RFID tag, et cetera, communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system or a particular RF frequency for some systems) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to an antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

While transmitters generally include a data modulation stage, one or more IF stages, and a power amplifier, the particular implementation of these elements is dependent upon the data modulation scheme of the standard being supported by the transceiver. For example, if the baseband modulation scheme is Gaussian Minimum Shift Keying (GMSK), the data modulation stage functions to convert digital words into quadrature modulation symbols, which have a constant amplitude and varying phases. The IF stage includes a phase locked loop (PLL) that generates an oscillation at a desired RF frequency, which is modulated based on the varying phases produced by the data modulation stage. The phase modulated RF signal is then amplified by the power amplifier in accordance with a transmit power level setting to produce a phase modulated RF signal.

As another example, if the data modulation scheme is 8-PSK (phase shift keying), the data modulation stage functions to convert digital words into symbols having varying amplitudes and varying phases. The IF stage includes a phase locked loop (PLL) that generates an oscillation at a desired RF frequency, which is modulated based on the varying phases produced by the data modulation stage. The phase modulated RF signal is then amplified by the power amplifier in accordance with the varying amplitudes to produce a phase and amplitude modulated RF signal.

As yet another example, if the data modulation scheme is x-QAM (16, 64, 128, 256 quadrature amplitude modulation), the data modulation stage functions to convert digital words into Cartesian coordinate symbols (e.g., having an in-phase signal component and a quadrature signal component). The IF stage includes mixers that mix the in-phase signal component with an in-phase local oscillation and mix the quadrature signal component with a quadrature local oscillation to produce two mixed signals. The mixed signals are summed together and filtered to produce an RF signal that is subsequently amplified by a power amplifier.

As the desire for wireless communication devices to support multiple standards continues, recent trends include the desire to integrate more functions on to a single chip. However, such desires have gone unrealized when it comes to implementing baseband and RF on the same chip for multiple wireless communication standards. In addition, many components and/or modules within the components employed within such communication devices and wireless communication devices include many off-chip elements.

Within many communication devices, there can be a need to perform processing of various signals (e.g., multiplication, division, addition, and/or subtraction). In some instances, a single signal (or variants generated there from) can be employed by different components, modules, and/or functional blocks within such a communication device.

Within certain communication devices and applications, there are varying design requirements related to noise (e.g., phase noise). Certain prior art approaches to performing processing of such signals within communication devices do not provide a sufficiently low degree of phase noise. In addition, many of the prior art approaches to performing processing of such signals within communication devices are inherently space consumptive and oftentimes consequently have higher production costs.

FIG. 5 and FIG. 6 are diagrams illustrating prior art approaches 500 and 600 to performing voltage division.

Referring to FIG. 5, a differential input signal in/ip is provided to AC coupling capacitors to generate a differential input voltage at the gates of the depicted devices. The differential input voltage is provided to the gates of four n-channel metal oxide semiconductor field-effect transistors (N-MOSFETs) implemented across a bottom row of the FIG. 5. The gates of two of these N-MOSFETs are coupled together, and the gates of the other two of these N-MOSFETs are coupled together. Also, as can be seen in the diagram, the sources of two of these N-MOSFETs are coupled together, and the sources of the other two of these N-MOSFETs are coupled together.

Two resistors (Rin and Rip) are coupled between a power supply voltage (shown as Vdd1) and the drains of a first pair of n-channel metal oxide semiconductor field-effect transistors (N-MOSFETs). The sources of these two N-MOSFETs are coupled together and also coupled to the source of one of the N-MOSFETs of the bottom row of the FIG. 5.

A second pair of N-MOSFETs is implemented such that the drain of one N-MOSFET of the second pair and a gate of the other N-MOSFET of the second pair are coupled to a drain of the N-MOSFET of the first pair that is also coupled to the resistor Rip. The drain of the other N-MOSFET of the second pair and a gate of the other N-MOSFET of the second pair are coupled to a drain of the N-MOSFET of the first pair that is also coupled to the resistor Rin. The sources of the N-MOSFETs of the second pair are also coupled together and also coupled to the source of one of the N-MOSFETs of the bottom row of the FIG. 5.

Two resistors (Rqn and Rqp) are coupled between the power supply voltage (shown as Vdd1) and the drains of a third pair of n-channel metal oxide semiconductor field-effect transistors (N-MOSFETs). The sources of these two N-MOSFETs are coupled together and also coupled to the source of one of the N-MOSFETs of the bottom row of the FIG. 5.

A fourth pair of N-MOSFETs is implemented such that the drain of one N-MOSFET of the fourth pair and a gate of the other N-MOSFET of the fourth pair are coupled to a drain of the N-MOSFET of the third pair that is also coupled to the resistor Rqp. The drain of the other N-MOSFET of the fourth pair and a gate of the other N-MOSFET of the fourth pair are coupled to a drain of the N-MOSFET of the third pair that is also coupled to the resistor Rqn. The sources of the N-MOSFETs of the fourth pair are also coupled together and also coupled to the source of one of the N-MOSFETs of the bottom row of the FIG. 5.

Two separate differential output voltages are provided within the FIG. 5, shown as oin/oip and oqn/oqp. These two separate differential output voltages can be viewed as being in-phase and quadrature voltage signals, respectively.

Referring to FIG. 6, this prior art embodiment includes the use of transmission gates that are depicted using dashed lines. Pair of p-channel metal oxide semiconductor field-effect transistors (P-MOSFETs) and N-MOSFETs are employed as depicted in the diagram, such that four transmission gates are implemented between each stage of P-MOSFETs and N-MOSFETs. A top row and a second row from top include pairs of P-MOSFETs. A bottom row and a second row from bottom include pairs of N-MOSFETs.

From certain perspectives, the prior art embodiment of FIG. 6 can be viewed as being a digital version of the prior art embodiment of FIG. 5. This digital version in the FIG. 6 is a complementary metal-oxide-semiconductor (CMOS) implementation, in that it has no DC current dissipation once the start up transients have passed.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

A novel apparatus is presented herein that employs at least two separate dividers implemented to support two separate modes of operation. In addition, the relative characteristics of the at least two dividers allows for a selective design of the apparatus to allow for one of the dividers to be of a higher caliber (e.g., such as with respect to a phase noise characteristic) than the other or others of the dividers. This can allow a designer to implement a higher grade divider where needed, and to implement a relatively lower grade divider when allowed within the overall design of the apparatus.

In one embodiment, a lower grade divider is employed within a feedback loop within a phase locked loop (PLL). Another divider or other dividers (e.g., implemented outside of the PLL) can have a relatively lower noise characteristic than the divider implemented within the PLL. The divider within the PLL can be of a lower grade (e.g., have a higher noise characteristic) than those dividers implemented outside of the PLL because the overall filtering operations of the PLL can compensate for/correct for any poor noise characteristic of the divider within the PLL.

This bifurcation and/or sub-division of dividers within the apparatus allows for the implementation of an apparatus that can have smaller components than in prior art approaches. For example, the overall voltage drop across a device can be reduced to achieve the same voltage drop across the length of the gate of the device. This can help avoid the breakdown of the device over time.

Moreover, because certain elements within a communication device (e.g., within a transmitter portion of a communication device) sometimes have a need for a lower phase noise than is required within other elements of the communication device. This generally can require a higher power than elements that can operate with a lower phase noise characteristic. This higher power generally requires a large current, and the bond wires of such a higher power element generally have a higher voltage drop. Therefore, the higher the current, then it follows that there is a larger voltage drop across the element, and this cuts into the overall headroom (i.e., total voltage drop available) within the apparatus. These problems become even more exacerbated in higher frequency applications. For example, the impedance (e.g., inductance) of an element varies with frequency (e.g., $X_L=j\omega L$). The higher the frequency of operation, then higher is the impedance. This also increases the voltage drop across the element, and this also cuts into the overall headroom within the apparatus.

Figure 1:
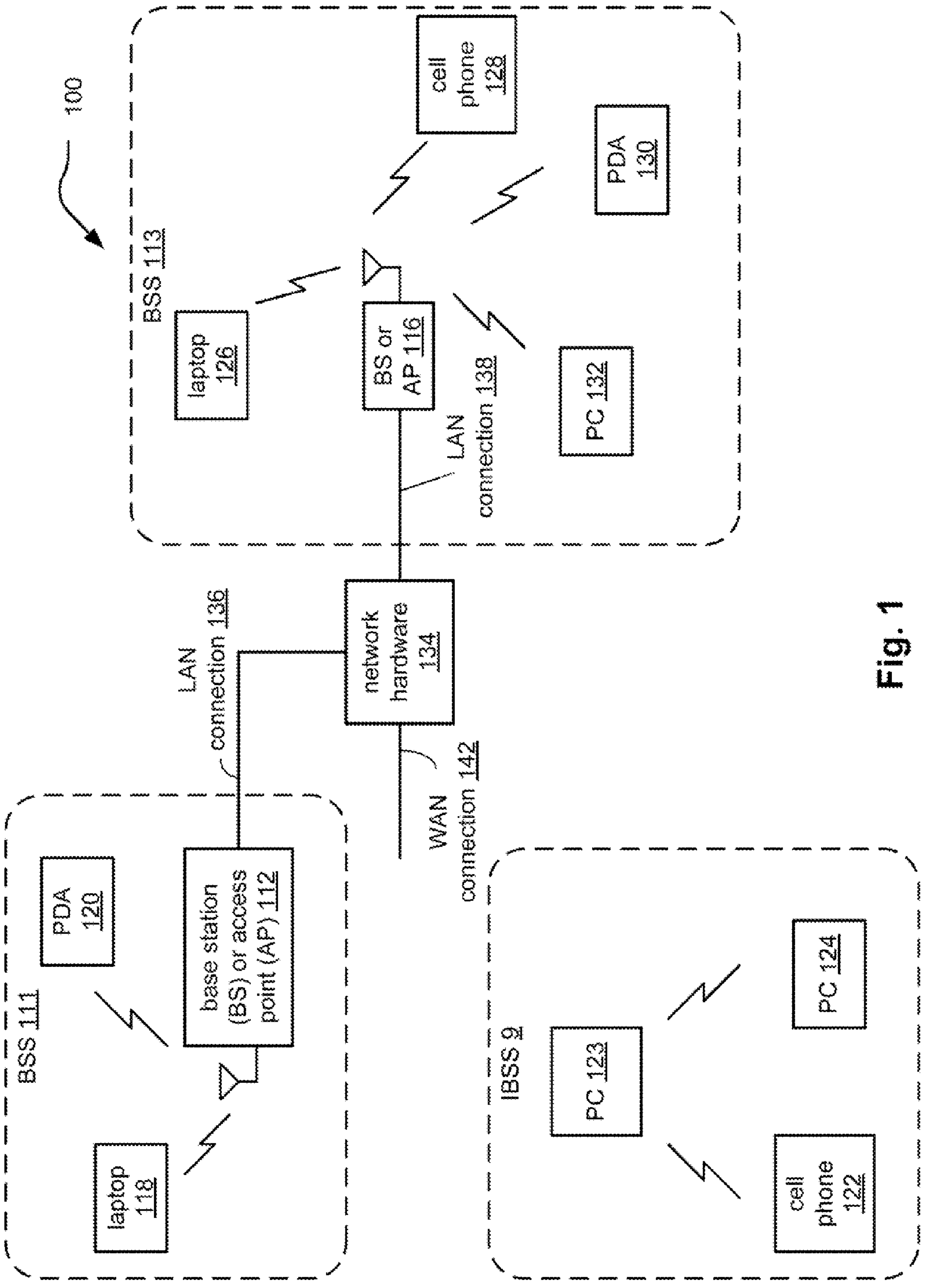
FIG. 1 is a diagram illustrating an embodiment of a wireless communication system.

FIG. 1 is a diagram illustrating an embodiment of a wireless communication system 100. The wireless communication system 100 includes a plurality of base stations and/or access points 112, 116, a plurality of wireless communication devices 118-132 and a network hardware component 134. Note that the network hardware 134, which may be a router, switch, bridge, modem, system controller, et cetera, provides a wide area network connection 142 for the communication system 100. Further note that the wireless communication devices 118-132 may be laptop host computers 118 and 126, personal digital assistant hosts 120 and 130, personal computer hosts 124 and 132 and/or cellular telephone hosts 122 and 128.

Wireless communication devices 122, 123, and 124 are located within an independent basic service set (IBSS) area and communicate directly (i.e., point to point). In this configuration, these devices 122, 123, and 124 may only communicate with each other. To communicate with other wireless communication devices within the system 100 or to communicate outside of the system 100, the devices 122, 123, and/or 124 need to affiliate with one of the base stations or access points 112 or 116.

The base stations or access points 112, 116 are located within basic service set (BSS) areas 111 and 113, respectively, and are operably coupled to the network hardware 134 via local area network connections 136, 138. Such a connection provides the base station or access point 112-116 with connectivity to other devices within the system 100 and provides connectivity to other networks via the WAN connection 142. To communicate with the wireless communication devices within its BSS 111 or 113, each of the base stations or access points 112-116 has an associated antenna or antenna array. For instance, base station or access point 112 wirelessly communicates with wireless communication devices 118 and 120 while base station or access point 116 wirelessly communicates with wireless communication devices 126-132. Typically, the wireless communication devices register with a particular base station or access point 112, 116 to receive services from the communication system 100.

Typically, base stations are used for cellular telephone systems (e.g., advanced mobile phone services (AMPS), digital AMPS, global system for mobile communications (GSM), code division multiple access (CDMA), local multi-point distribution systems (LMDS), multi-channel-multi-point distribution systems (MMDS), Enhanced Data rates for GSM Evolution (EDGE), General Packet Radio Service (GPRS), high-speed downlink packet access (HSDPA), high-speed uplink packet access (HSUPA and/or variations thereof) and like-type systems, while access points are used for in-home or in-building wireless networks (e.g., IEEE 802.11, Bluetooth, ZigBee, any other type of radio frequency based network protocol and/or variations thereof). Regardless of the particular type of communication system, each wireless communication device includes a built-in radio and/or is coupled to a radio.

Figure 2:
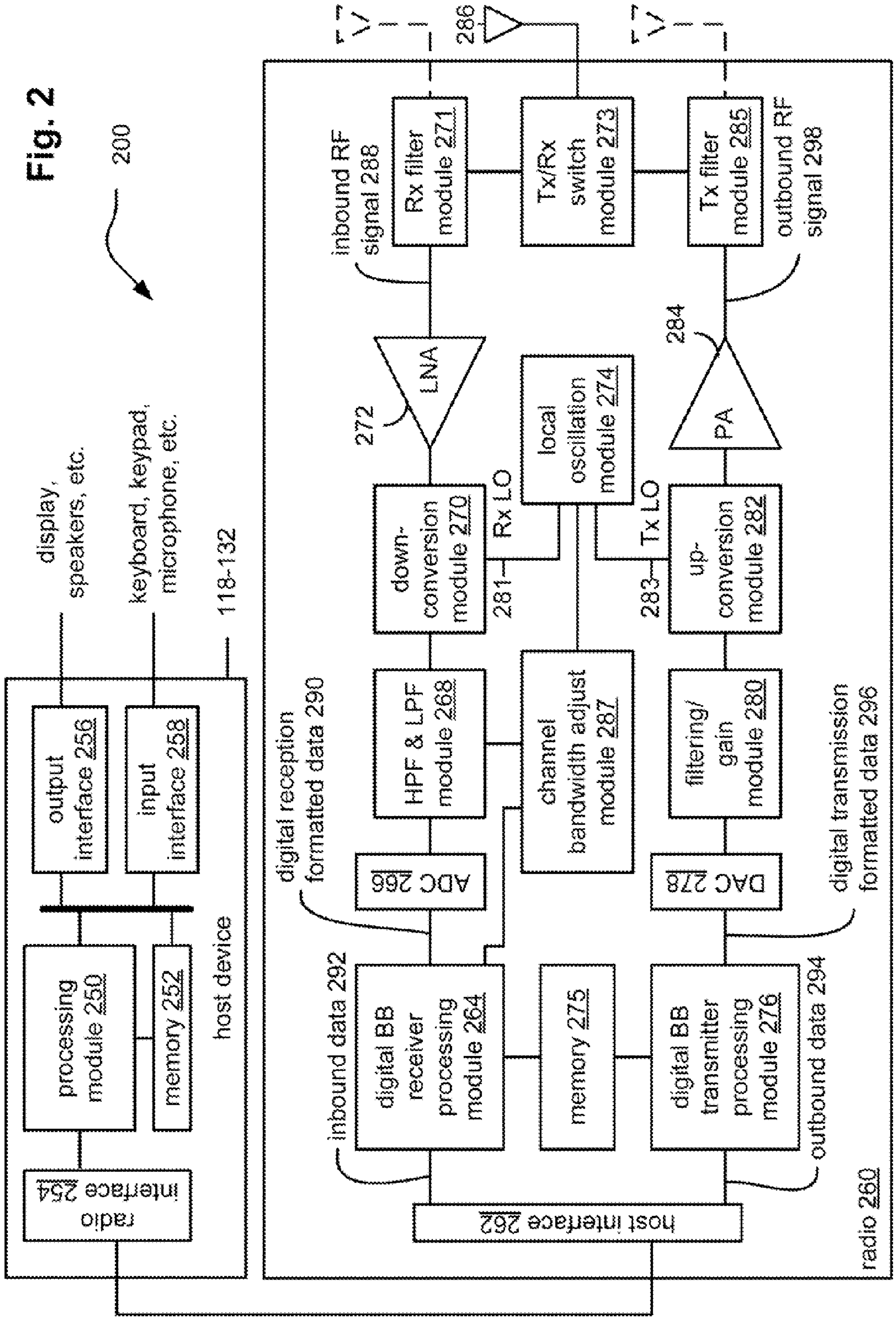
FIG. 2 is a diagram illustrating an embodiment of a wireless communication device.

FIG. 2 is a diagram illustrating an embodiment of a wireless communication device 200 that includes the host device 118-132 and an associated radio 260. For cellular telephone hosts, the radio 260 is a built-in component. For personal digital assistants hosts, laptop hosts, and/or personal computer hosts, the radio 260 may be built-in or an externally coupled component.

As illustrated, the host device 118-132 includes a processing module 250, memory 252, a radio interface 254, an input interface 258, and an output interface 256. The processing module 250 and memory 252 execute the corresponding instructions that are typically done by the host device. For example, for a cellular telephone host device, the processing module 250 performs the corresponding communication functions in accordance with a particular cellular telephone standard.

The radio interface 254 allows data to be received from and sent to the radio 260. For data received from the radio 260 (e.g., inbound data), the radio interface 254 provides the data to the processing module 250 for further processing and/or routing to the output interface 256. The output interface 256 provides connectivity to an output display device such as a display, monitor, speakers, et cetera, such that the received data may be displayed. The radio interface 254 also provides data from the processing module 250 to the radio 260. The processing module 250 may receive the outbound data from an input device such as a keyboard, keypad, microphone, et cetera, via the input interface 258 or generate the data itself. For data received via the input interface 258, the processing module 250 may perform a corresponding host function on the data and/or route it to the radio 260 via the radio interface 254.

Radio 260 includes a host interface 262, digital receiver processing module 264, an analog-to-digital converter 266, a high pass and low pass filter module 268, an IF mixing down conversion stage 270, a receiver filter 271, a low noise amplifier 272, a transmitter/receiver switch 273, a local oscillation module 274, memory 275, a digital transmitter processing module 276, a digital-to-analog converter 278, a filtering/gain module 280, an IF mixing up conversion stage 282, a power amplifier 284, a transmitter filter module 285, a channel bandwidth adjust module 287, and an antenna 286. The antenna 286 may be a single antenna that is shared by the transmit and receive paths as regulated by the Tx/Rx switch 273, or may include separate antennas for the transmit path and receive path. The antenna implementation will depend on the particular standard to which the wireless communication device 200 is compliant.

The digital receiver processing module 264 and the digital transmitter processing module 276, in combination with operational instructions stored in memory 275, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 264 and 276 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 275 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 264 and/or 276 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 260 receives outbound data 294 from the host device via the host interface 262. The host interface 262 routes the outbound data 294 to the digital transmitter processing module 276, which processes the outbound data 294 in accordance with a particular wireless communication standard (e.g., IEEE 802.11, Bluetooth, ZigBee, any other type of radio frequency based network protocol and/or variations thereof et cetera) to produce outbound baseband signals 296. The outbound baseband signals 296 will be digital base-band signals (e.g., have a zero IF) or digital low IF signals, where the low IF typically will be in the frequency range of one hundred kHz (kilo-Hertz) to a few MHz (Mega-Hertz).

The digital-to-analog converter 278 converts the outbound baseband signals 296 from the digital domain to the analog domain. The filtering/gain module 280 filters and/or adjusts the gain of the analog signals prior to providing it to the IF mixing stage 282. The IF mixing stage 282 converts the analog baseband or low IF signals into RF signals based on a transmitter local oscillation 283 provided by local oscillation module 274. The power amplifier 284 amplifies the RF signals to produce outbound RF signals 298, which are filtered by the transmitter filter module 285. The antenna 286 transmits the outbound RF signals 298 to a targeted device such as a base station, an access point and/or another wireless communication device 200.

The radio 260 also receives inbound RF signals 288 via the antenna 286, which were transmitted by a base station, an access point, or another wireless communication device. The antenna 286 provides the inbound RF signals 288 to the receiver filter module 271 via the Tx/Rx switch 273, where the Rx filter 271 bandpass filters the inbound RF signals 288. The Rx filter 271 provides the filtered RF signals to low noise amplifier 272, which amplifies the signals 288 to produce an amplified inbound RF signals. The low noise amplifier 272 provides the amplified inbound RF signals to the IF mixing module 270, which directly converts the amplified inbound RF signals into an inbound low IF signals or baseband signals based on a receiver local oscillation 281 provided by local oscillation module 274. The down conversion module 270 provides the inbound low IF signals or baseband signals to the filtering/gain module 268. The high pass and low pass filter module 268 filters, based on settings provided by the channel bandwidth adjust module 287, the inbound low IF signals or the inbound baseband signals to produce filtered inbound signals.

The analog-to-digital converter 266 converts the filtered inbound signals from the analog domain to the digital domain to produce inbound baseband signals 290, where the inbound baseband signals 290 will be digital base-band signals or digital low IF signals, where the low IF typically will be in the frequency range of one hundred kHz to a few MHz. The digital receiver processing module 264, based on settings provided by the channel bandwidth adjust module 287, decodes, descrambles, demaps, and/or demodulates the inbound baseband signals 290 to recapture inbound data 292 in accordance with the particular wireless communication standard being implemented by radio 260. The host interface 262 provides the recaptured inbound data 292 to the host device 118-132 via the radio interface 254.

As one of average skill in the art will appreciate, the wireless communication device 200 of FIG. 2 may be implemented using one or more integrated circuits. For example, the host device may be implemented on one integrated circuit, the digital receiver processing module 264, the digital transmitter processing module 276 and memory 275 may be implemented on a second integrated circuit, and the remaining components of the radio 260, less the antenna 286, may be implemented on a third integrated circuit. As an alternate example, the radio 260 may be implemented on a single integrated circuit. As yet another example, the processing module 250 of the host device and the digital receiver and transmitter processing modules 264 and 276 may be a common processing device implemented on a single integrated circuit. Further, the memory 252 and memory 275 may be implemented on a single integrated circuit and/or on the same integrated circuit as the common processing modules of processing module 250 and the digital receiver and transmitter processing module 264 and 276.

Figure 3:
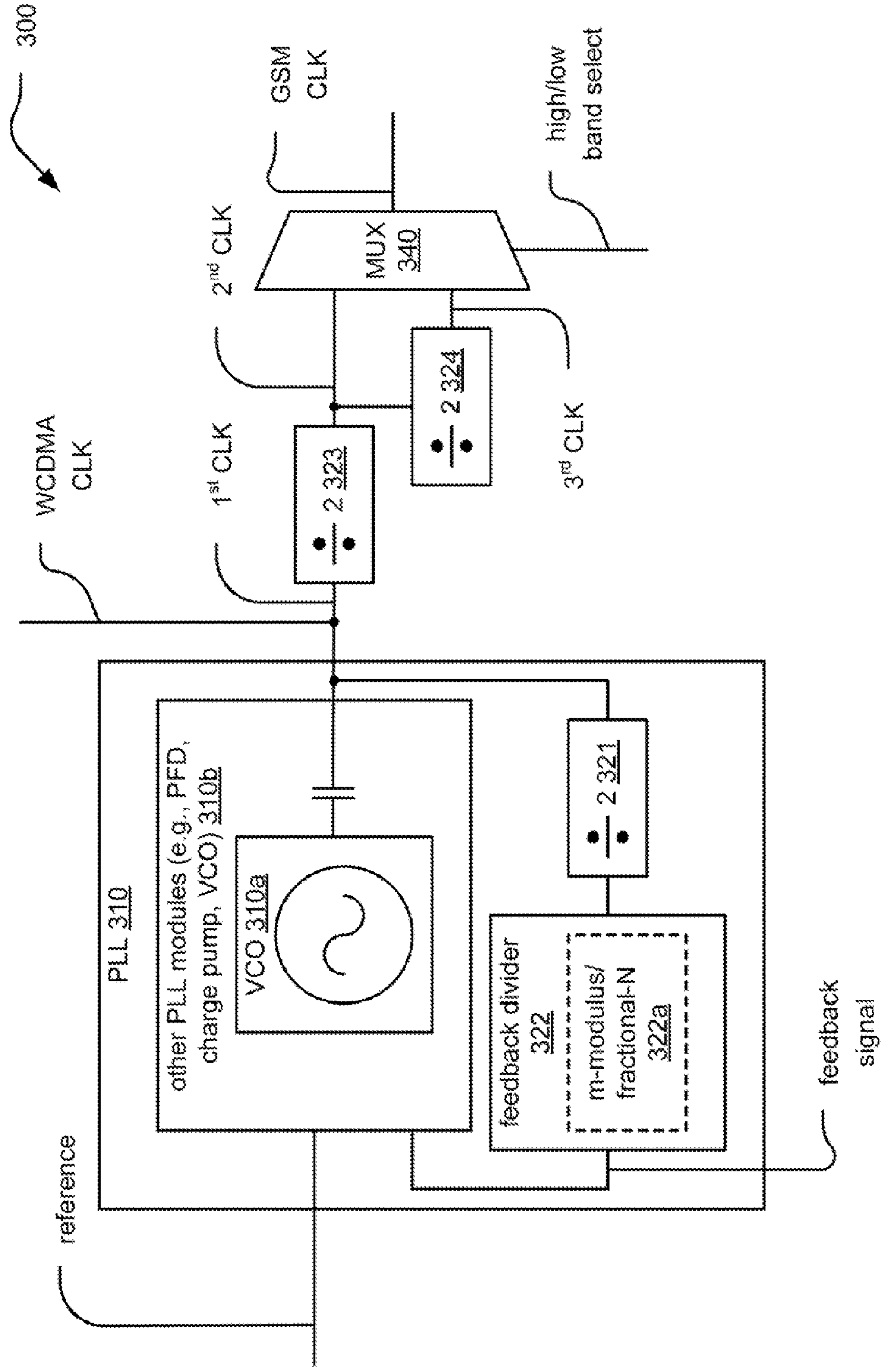
FIG. 3 is a diagram illustrating an embodiment of an apparatus that includes a phase locked loop (PLL).

FIG. 3 is a diagram illustrating an embodiment of an apparatus 300 that includes a phase locked loop (PLL). The apparatus 300 includes a phase locked loop (PLL) 310 that receives a reference signal. The PLL 310 includes a first divider 321 and a second divider 322 as well as a voltage controlled oscillator (VCO) 310*a*. In addition to the VCO 310*a*, the PLL 310 can also include other PLL modules such as phase/frequency detector, charge pump, loop filter (e.g., oftentimes a low pass filter), buffers, etc. as well without departing from the scope and spirit of the invention (as generally depicted by reference numeral 310*b*). Moreover, other embodiments of a PLL can alternatively be employed without departing from the scope and spirit of the invention.

The output from the VCO 310*a* within the PLL 310 is provided as a first clock signal. This first clock signal can be employed when the apparatus operates to support a first operational mode. The first clock signal is also output to a divider 323 that is operable to perform division of the first clock signal thereby generating a second clock signal. This second clock signal can be employed when the apparatus operates to support a second operational mode.

In some embodiments, the first clock signal can be employed when operating in accordance with a wideband Code Division Multiple Access (CDMA) mode, and the second clock signal is employed when operating in accordance with a Global System for Mobile communications (GSM) mode. Moreover, the second clock signal can also undergo subsequent processing (within a divider 324) to generate a third clock signal. The second clock signal and the third clock signal can each be employed when the apparatus operates within a high band of the GSM mode and a low band of the GSM mode, respectively, while the apparatus is operating within the GSM mode. A multiplexer (MUX) 340 can be implemented to allow the selection of either the second or the third clock signal.

The output from the VCO 310*a* within the PLL 310 is also fed back to a divider 321 implemented within the PLL 310, and the output of the divider 321 is provided to a feedback divider 322. The feedback divider 322 can be implemented as an m-modulus or fractional-N divider 322*a* (where either of m and N is a selected integer value).

In this embodiment, each of the dividers 321, 323, and 324 are shown as divide by 2 modules. The phase noise characteristic of the divider 321 within the PLL 310 is of a lower grade than the divider 323. When compared to a prior art implementation, a prior art single divider can be viewed as being partitioned into the divider 321 and 323. This allows the use of a relatively lower grade (e.g., higher phase noise characteristic) divider in the PLL 310 than the divider 323 employed outside of the PLL 310.

The divider 323 can be viewed as the divider employed to generate the clock signal that is employed when operating in the GSM mode (e.g., sometimes referred to as GSM edge). By using this sub-divided/partitioned implementation of dividers, the divider 323 can be a higher grade and have a lower phase noise characteristic than a high power divider described above, and the divider 321 within the PLL 310 can have poorer phase noise characteristics. The divider 321 implemented within the PLL 310 can also be a lower grade and have a higher phase noise characteristic than prior art approaches in which the dividers 321 and 323 are implemented within a single divider because all of the other elements within the PLL 310 inherently perform additional filtering of the feedback signal.

In certain contexts (e.g., cellular and other wireless applications), this can provide for a very good phase noise characteristic. In addition, power can be reduced in at least one of the operational modes (e.g., the wideband CDMA mode), because the other divider 323 (as well as the divider 324 for that matter) can be completely turned off. Actually, all of the circuitry and/or components to the right of divider 323 and including divider 323 can effectively be turned off when operating in the wideband CDMA mode. The GSM mode can be of higher power consumption than the wideband CDMA mode. Therefore, there can be significant power savings of a communication device including the apparatus 300 when operating in the wideband CDMA mode.

As is shown in the subsequent diagram and apparatus 400 (described in more detail below), some or all of the signals employed within the apparatus 300 can be differential in nature. All of the dividers 321, 322, 323, and 324 within the apparatus 300 can be digital in nature. In addition, all of the dividers 421, 423, and 424 within the apparatus 400 can also be digital in nature.

Because of this digital nature of the dividers employed herein, only a single AC coupling capacitor is employed after the VCO 310*a*. No other AC coupling stage (e.g., no other AC coupling capacitor) need be employed beyond the output of the VCO 310*a*.

If all of the dividers were not digital in nature, then additional AC coupling stages (e.g., AC coupling capacitors) could be implemented before and after each of the dividers 321, 322, 323, and 324 within the apparatus 300 and before and after each of the dividers 421, 423, and 424 within the apparatus 400.

Figure 4:
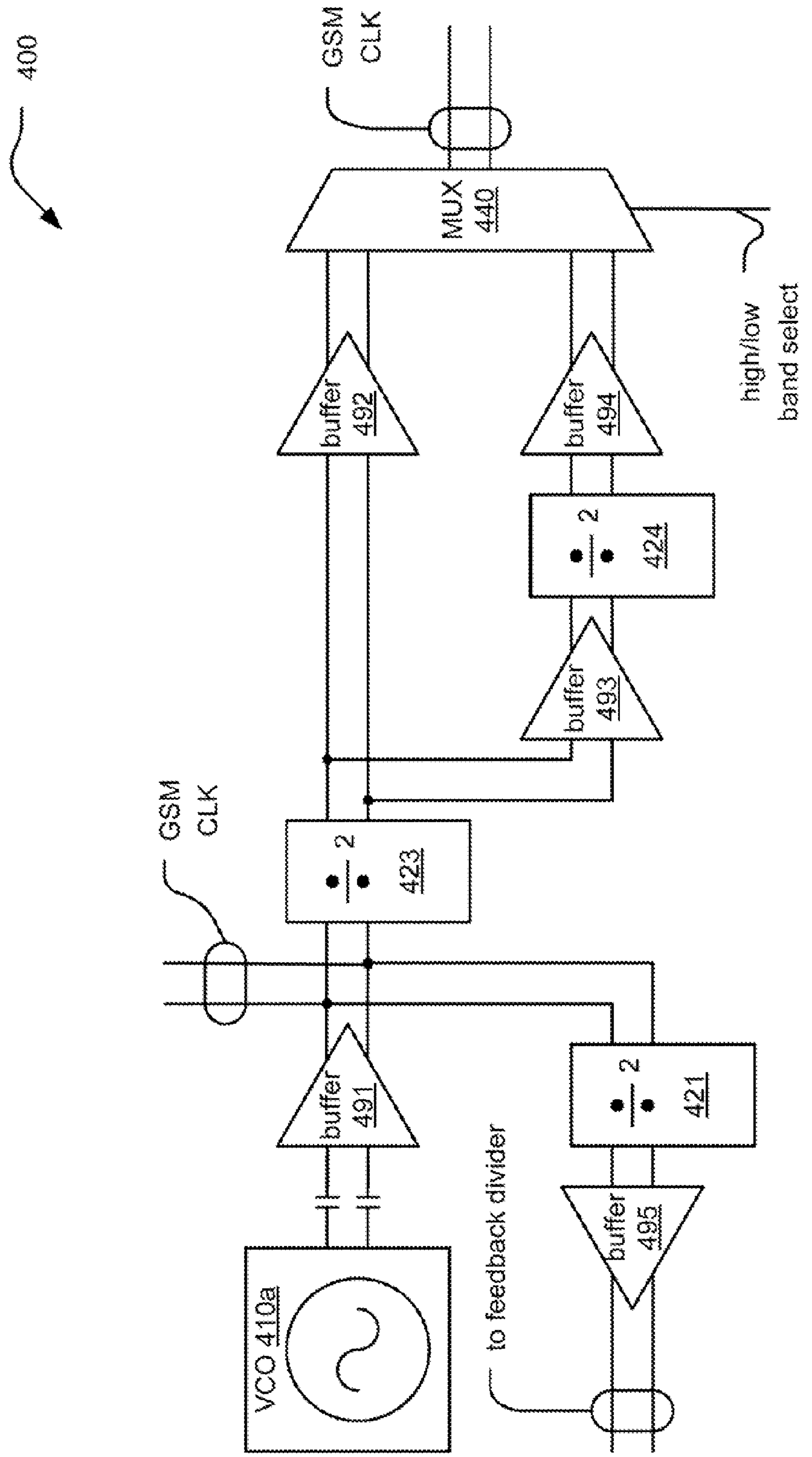
FIG. 4 is a diagram illustrating an alternative embodiment of an apparatus that includes a PLL (note: the diagram shows a portion of the PLL).

FIG. 4 is a diagram illustrating an alternative embodiment of an apparatus 400 that includes a PLL (note: the diagram shows a portion of the PLL). The apparatus 400 includes some similarity to the apparatus 300. A VCO 410*a* outputs a differential clock signal through a pair of AC coupling capacitors, and subsequently to a buffer 491, to provide a first clock signal (shown as a GSM clock). This buffer 491 (as well as other buffers depicted herein) can be implemented using two stages of buffers. A digital divider oftentimes looks like a capacitive type of load. The use of two successive buffer stages can be employed to reduce the capacitive load that the previous elements see. In this embodiment, if the buffer 491 is implemented as such (e.g., two successive buffers), then the capacitive load seen by the VCO 410*a* can be reduced. Nevertheless, the even if the buffer 491 is implemented as a sole buffer, the capacitive load seen by the VCO 410*a* is reduced.

Somewhat analogous to other embodiments, the output from the VCO 410*a* within a PLL is provided as a first clock signal (e.g., to support a wideband CDMA mode). This first clock signal can be employed when the apparatus operates to support a first operational mode. The first clock signal is also output via the buffer 491 to a divider 423 that is operable to perform division of the first clock signal thereby generating a second clock signal. This second clock signal can be employed when the apparatus operates to support a second operational mode (e.g., a GSM mode).

Also somewhat analogous to other embodiments, the first clock signal output from the VCO 410*a* can be employed when operating in accordance with a wideband CDMA mode, and the second clock signal (is employed when operating in accordance with a GSM mode. Moreover, the second clock signal can also undergo subsequent processing (after passing through a buffer 493, a divider 424, and a buffer 494) to generate a third clock signal. The second clock signal (finally output from a buffer 492 coupled to the divider 423) and the third clock signal (finally output from a buffer 494) can each be employed when the apparatus operates within a high band of the GSM mode and a low band of the GSM mode, respectively, while the apparatus is operating within the GSM mode. A MUX 440 can be implemented to allow the selection of either the second or the third clock signal.

The output from the VCO 410*a* within a PLL is also fed back to a divider 421 implemented within such a PLL, and the output of the divider 421 is provided through a buffer 495 and subsequently to a feedback divider. As with the previous embodiment, such a feedback divider can be implemented as an m-modulus or fractional-N divider (where either of m and N is a selected integer value).

It is noted that the various apparatus 300 and 400 within FIG. 3 and FIG. 4 can be employed within many of the various modules, processing modules, functional blocks, and/or combinations thereof as shown within FIG. 2. In some embodiments, the apparatus 300 or the apparatus 400 can be employed within the local oscillation module 274 to perform generation of a clock signal. More generally, the apparatus 300 or the apparatus 400 can be employed to perform generation of one or more clock signals within any of a number of communication devices, including those depicted with reference to FIG. 1.

It is noted that the various embodiments of apparatus depicted herein, and those constructed in accordance with certain aspects of the invention, overcome many of the prior art problems associated with phase noise issues and pulling between the VCO of a PLL and power amplifier (PA). Prior art approaches oftentimes tried to address the phase noise problem by using a larger power supply voltage (e.g., 2.8 V). The various embodiments of apparatus depicted herein, and those constructed in accordance with certain aspects of the invention, can operate with a relatively lower power supply voltage (e.g., 1.2 V) and operate well with respect to noise, phase noise, and modulation noise (e.g., AM, PM) design constraints. The divider modules employed herein can be implemented using all digital circuitry. Because of the all digital implementation of such dividers, there are no inductors and no resistors implemented therein.

Figure 5:
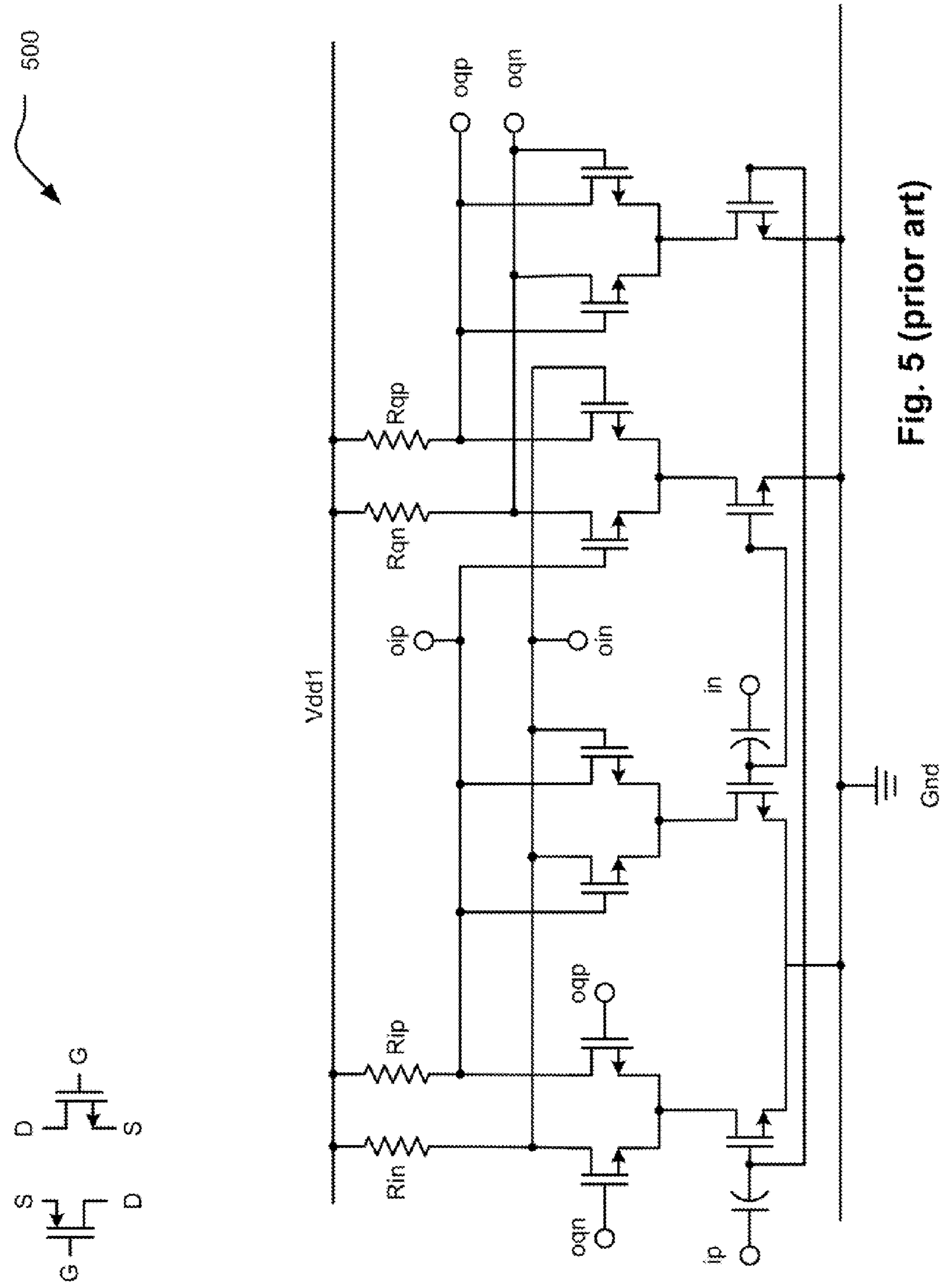
Fig. 5 (prior art)
FIG. 5 and FIG. 6 are diagrams illustrating prior art approaches to performing voltage division.
Figure 6:
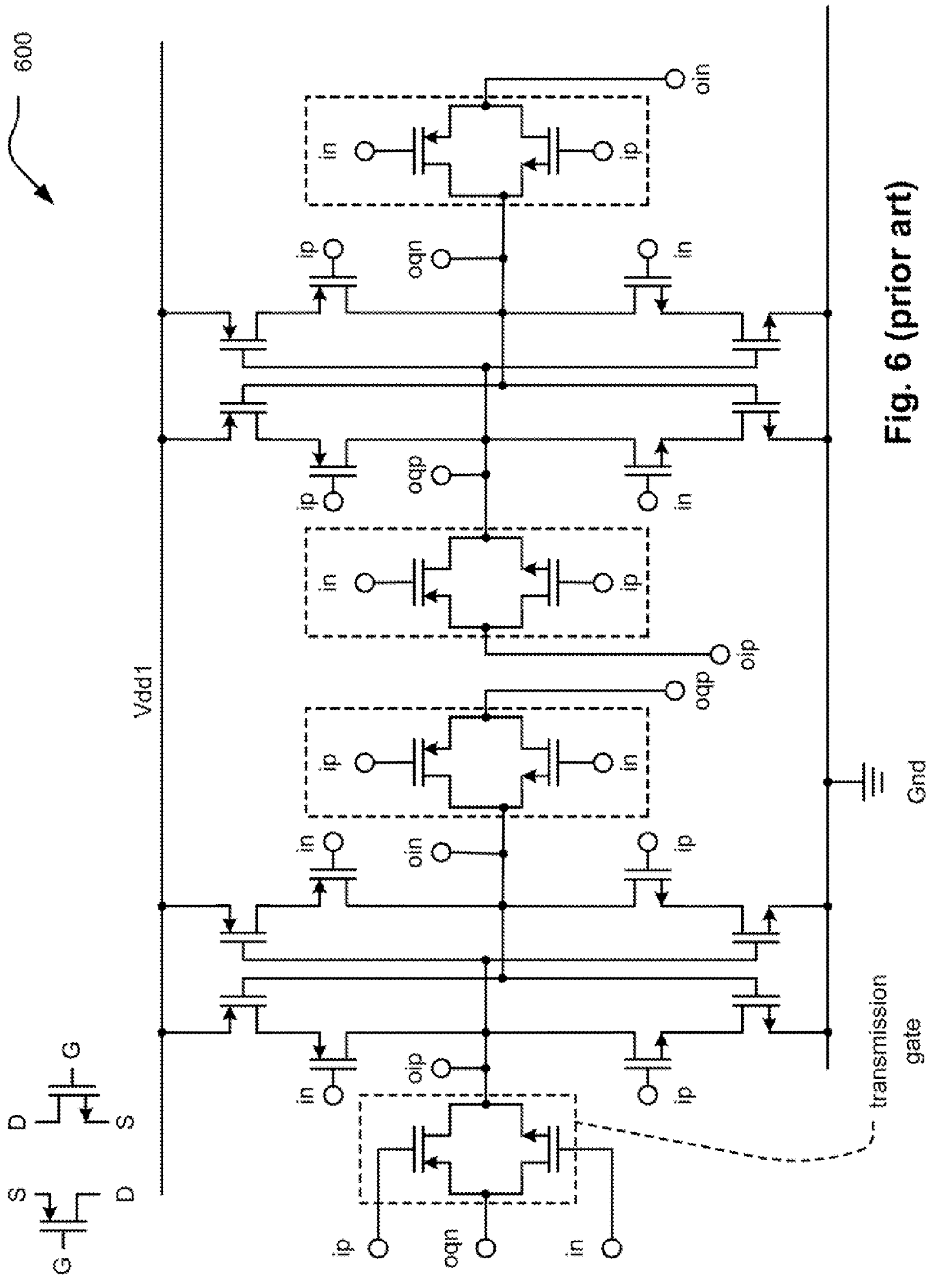
Fig. 6 (prior art)

FIG. 5 and FIG. 6 are diagrams illustrating prior art approaches 500 and 600 to performing voltage division.

More detailed description of FIG. 5 and FIG. 6 can be found in the "DESCRIPTION OF RELATED ART" section.

Figure 7:
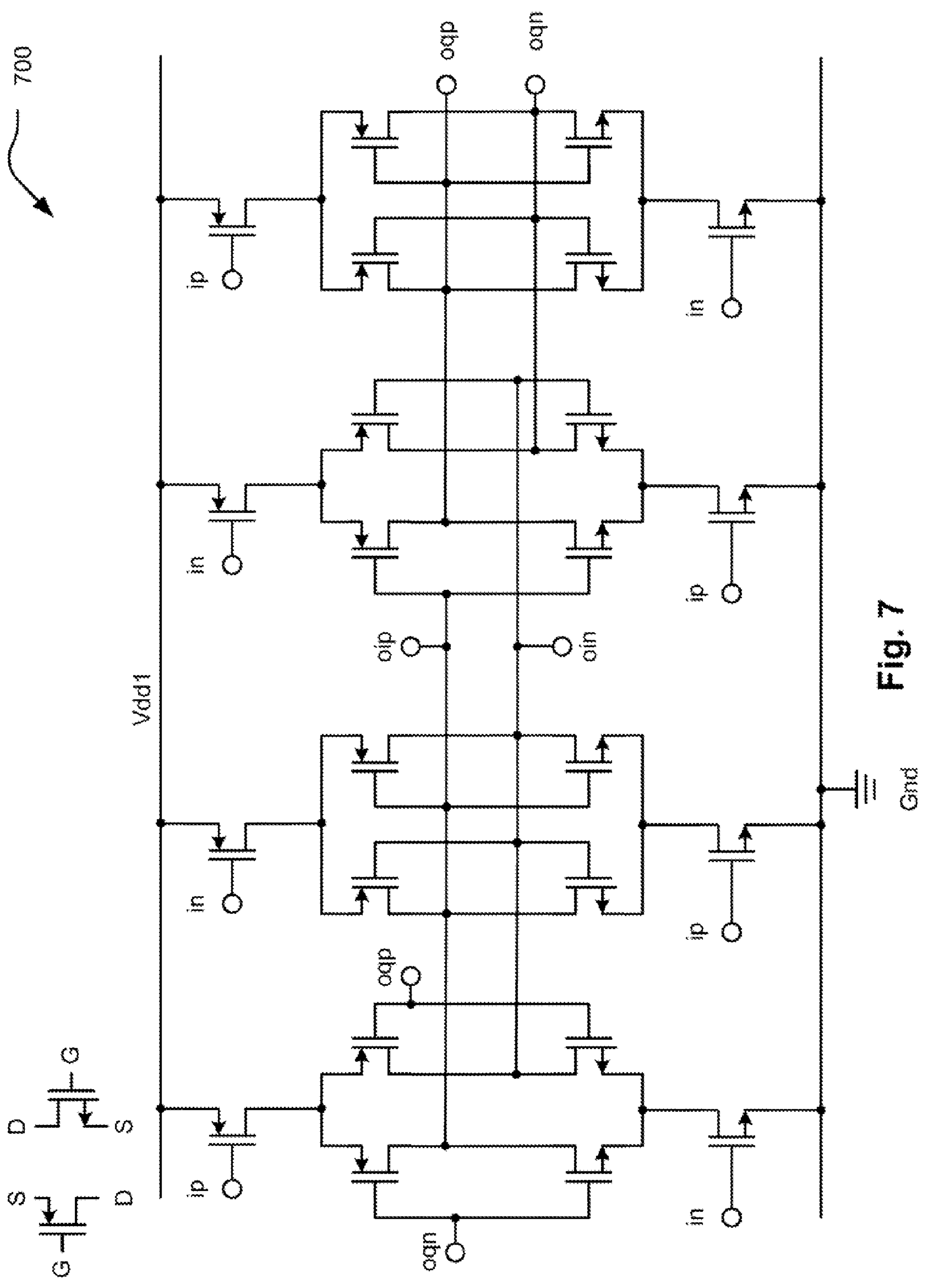
FIG. 7 and FIG. 8 are diagrams illustrating embodiments of circuitries that perform voltage division.
Figure 8:
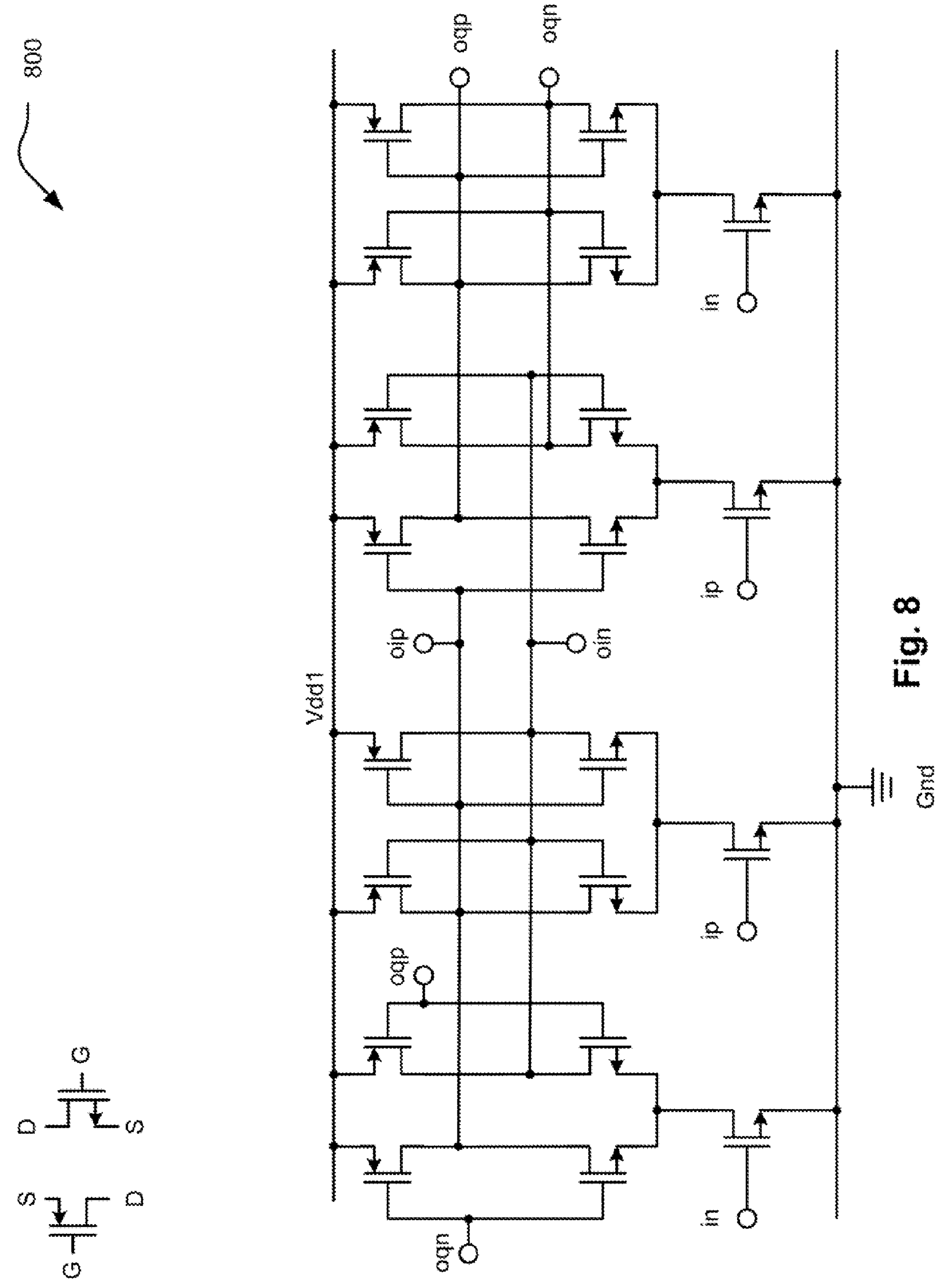

FIG. 7 and FIG. 8 are diagrams illustrating embodiments of circuitries 700 and 800 that perform voltage division.

Referring to circuitry 700 of FIG. 7, a differential input signal, shown as in/ip, are provided to the gates of four n-channel metal oxide semiconductor field-effect transistors (N-MOSFETs) whose sources are coupled to a ground voltage level. These four N-MOSFETs are shown as being implemented along a bottom row of the circuitry 700. Along a top row of the circuitry 700, four p-channel metal oxide semiconductor field-effect transistors (P-MOSFETs) are implemented such that the sources of each of the P-MOSFETs are coupled to a power supply voltage (e.g., shown as Vdd1).

Along a second to top row of the circuitry 700, four pairs (e.g., eight in total) of P-MOSFETs are implemented such that the sources of each pair are coupled together and the coupled sources of each P-MOSFET pair is coupled to a drain of a corresponding P-MOSFET of the top row of the circuitry 700.

Along a second to bottom row of the circuitry 700, four pairs (e.g., eight in total) of N-MOSFETs are also implemented such that the sources of each pair of N-MOSFETs are coupled together and the and the coupled sources of each P-MOSFET pair is coupled to a drain of a corresponding P-MOSFET of the top row of the circuitry 700 of the top row of the circuitry 700. The gate of each N-MOSFET in the second to bottom row is coupled to a gate of a corresponding P-MOSFET in the second to top row.

Looking from another perspective, the circuitry 700 can be viewed as including the following:

Starting from the left hand side of the diagram, the circuitry 700 includes first and second P-MOSFETs and first and second N-MOSFETs such that:

- a drain of the first P-MOSFET is coupled to a drain of the first N-MOSFET;
- a drain of the second P-MOSFET is coupled to a drain of the second N-MOSFET;
- a gate of the first P-MOSFET is coupled to a gate of the first N-MOSFET;
- a gate of the second P-MOSFET is coupled to a gate of the second N-MOSFET; and
- a source of the first N-MOSFET is coupled to a source of the second N-MOSFET.

Continuing to the right within the diagram, the circuitry 700 includes third and fourth P-MOSFETs and third and fourth N-MOSFETs such that:

- a drain of the third P-MOSFET is coupled to a drain of the third N-MOSFET;
- a drain of the fourth P-MOSFET is coupled to a drain of the fourth N-MOSFET;
- a gate of the third P-MOSFET is coupled to a gate of the third N-MOSFET;
- a gate of the fourth P-MOSFET is coupled to a gate of the fourth N-MOSFET;
- a source of the third N-MOSFET is coupled to a source of the fourth N-MOSFET;
- the drain of the first P-MOSFET is coupled to the drain of the third P-MOSFET and is coupled to the gate of the fourth P-MOSFET; and
- the drain of the second P-MOSFET is coupled to the drain of the fourth N-MOSFET and is coupled to the gate of the third P-MOSFET.

Continuing to the right within the diagram, the circuitry 700 includes fifth and sixth P-MOSFETs and fifth and sixth N-MOSFETs such that:

- a drain of the fifth P-MOSFET is coupled to a drain of the fifth N-MOSFET;
- a drain of the sixth P-MOSFET is coupled to a drain of the sixth N-MOSFET;
- a gate of the fifth P-MOSFET is coupled to a gate of the fifth N-MOSFET;
- a gate of the sixth P-MOSFET is coupled to a gate of the sixth N-MOSFET;
- a source of the fifth N-MOSFET is coupled to a source of the sixth N-MOSFET;
- the drain of the third P-MOSFET is coupled to the coupled gates of the fifth P-MOSFET and the fifth N-MOSFET; and
- the drain of the fourth P-MOSFET is coupled to the coupled gates of the sixth P-MOSFET and the sixth N-MOSFET;

Continuing to the right within the diagram, the circuitry 700 includes seventh and eighth P-MOSFETs and seventh and eighth N-MOSFETs such that:

- a drain of the seventh P-MOSFET is coupled to a drain of the seventh N-MOSFET;
- a drain of the eighth P-MOSFET is coupled to a drain of the eighth N-MOSFET;
- a gate of the seventh P-MOSFET is coupled to a gate of the seventh N-MOSFET;
- a gate of the eighth P-MOSFET is coupled to a gate of the eighth N-MOSFET;
- a source of the seventh N-MOSFET is coupled to a source of the eighth N-MOSFET;
- the drain of the fifth P-MOSFET is coupled to the drain of the seventh P-MOSFET and is coupled to the gate of the eighth P-MOSFET; and
- the drain of the sixth P-MOSFET is coupled to the drain of the eighth N-MOSFET and is coupled to the gate of the seventh P-MOSFET.

The bottom row of the circuitry 700 can be viewed as including a ninth N-MOSFET, a tenth N-MOSFET, an eleventh N-MOSFET, and a twelfth N-MOSFET. The ninth N-MOSFET includes a drain that is coupled to the coupled sources of the first and second N-MOSFETs and whose source is coupled to a ground voltage level. The tenth N-MOSFET includes a drain that is coupled to the coupled sources of the third and fourth N-MOSFETs and whose source is coupled to the ground voltage level. The eleventh N-MOSFET includes drain that is coupled to the coupled sources of the fifth and sixth N-MOSFETs and whose source is coupled to the ground voltage level. The twelfth N-MOSFET includes a drain that is coupled to the coupled sources of the seventh and eighth N-MOSFETs and whose source is coupled to the ground voltage level.

The top row of the circuitry 700 can be viewed as including a ninth P-MOSFET, a tenth P-MOSFET, an eleventh P-MOSFET, and a twelfth P-MOSFET. As can be seen, the ninth P-MOSFET includes a drain is coupled to the coupled sources of the first and second P-MOSFETs and a source that is coupled to a power supply voltage. The tenth P-MOSFET includes a drain that is coupled to the coupled sources of the third and fourth P-MOSFETs and a source that source is coupled to the power supply voltage. The eleventh P-MOSFET includes a drain that is coupled to the coupled sources of the fifth and sixth P-MOSFETs and a source that source is coupled to the power supply voltage. The twelfth P-MOSFET includes a drain that is coupled to the coupled sources of the seventh and eighth P-MOSFETs and a source that source is coupled to the power supply voltage.

As can be seen within this embodiment, the circuitry 700 includes four active circuitry element levels stacked between the power supply voltage and the ground voltage level. This can be viewed as being the four separate rows described above of each of the various elements.

Two separate differential output voltages are provided by the circuitry 700, shown as oin/oip and oqn/oqp. These two separate differential output voltages can be viewed as being in-phase and quadrature voltage signals, respectively.

As can be seen also with respect to the comparison to the prior art embodiment within FIG. 6, the circuitry 700 of the FIG. 7 replaces the transmission gates of the FIG. 6 with buffers. In operation, these buffers are turned on and off and this speeds up the overall operation of the divider while providing better phase noise with lower power consumption than the prior art embodiment of FIG. 6.

However, the circuitry 700 still includes four active circuitry element levels stacked between the power supply voltage and the ground voltage level. Because of relatively large voltage drops across the many bond wires of such an embodiment, and when operating using a relatively low power supply voltage level (e.g., a lowered headroom when compared to some previous approaches), although still operable, this embodiment can sometimes be very close to design margins. This problem is exacerbated when operating at higher frequencies while requiring lower phase noise, in that, generally larger valued currents are required, and this inherently results in larger voltage drops across the bond wires. The following embodiment provides one variation to alleviate this situation of creeping so closely to the available headroom.

Referring to circuitry 800 of FIG. 8, this embodiment is somewhat analogous to the previous embodiment with at least one difference being that the top rows of P-MOSFET elements is removes, and the four pairs (e.g., eight in total) of P-MOSFETs are implemented such that the sources of each are coupled to a power supply voltage (e.g., shown as Vdd1).

Compared to the previous circuitry 700 of FIG. 7, the circuitry 800 of the FIG. 8 is a pseudo-complementary metal-oxide-semiconductor (CMOS), in that, it is not a true CMOS type circuitry that has no DC current dissipation. The circuitry 800 has 4 different paths that get DC current (e.g., each of the four paths via the four N-MOSFETs whose sources are coupled to the ground voltage level). Each path gets a DC current 25% of the time. There is therefore some DC current that gets dissipated (unlink true CMOS) at any given time. Nevertheless, the circuitry 800 does operate rail to rail (like true CMOS). Also, the circuitry 800 does operate well at relatively high frequencies and relatively low power supply voltage levels when compared to the prior art approaches of the FIG. 5 and the FIG. 6. The circuitry 800 only includes three active circuitry element levels stacked between the power supply voltage and the ground voltage level. The circuitry 800 (when compared to the circuitry 700) provides for a greater area savings (e.g., because of the fewer elements) and also provides reduced input capacitance than the four active circuitry element levels embodiment of the circuitry 700.

It is noted that in at least one embodiment of apparatus and circuitry depicted herein, and one constructed in accordance with certain aspects of the invention, includes P-MOSFET and N-MOSFET input transistors for receiving a differential signal. It is noted that in at least one other embodiment of apparatus and circuitry depicted herein, and one constructed in accordance with certain aspects of the invention, includes inverters implemented as an N-MOSFET input transistor for receiving a single-ended signal.

As mentioned above, many prior art approaches employed using a larger power supply voltage (e.g., 2.8 V). The various embodiments of apparatus and circuitry depicted herein, and those constructed in accordance with certain aspects of the invention, can operate with a relatively lower power supply voltage (e.g., 1.2 V). again, the divider modules employed herein can be implemented using all digital circuitry. Because of the all digital implementation of such dividers, there are no inductors and no resistors implemented therein. Also, because of this all digital implementation, there is no need for multiple AC coupling stages (e.g., AC coupling capacitors) which saves area.

It is noted that the various modules (e.g., modules, processing modules, etc.) described herein may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory. The memory may be a single memory device or a plurality of memory devices. Such a memory device may be a read-only memory, random access memory, volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed is:

1. A circuitry that is operable to perform digital division of a signal, the circuitry comprising:

first and second p-channel metal oxide semiconductor field-effect transistors (P-MOSFETs);

first and second n-channel metal oxide semiconductor field-effect transistors (N-MOSFETs), wherein;

a drain of the first P-MOSFET is coupled to a drain of the first N-MOSFET;

a drain of the second P-MOSFET is coupled to a drain of the second N-MOSFET;

a gate of the first P-MOSFET is coupled to a gate of the first N-MOSFET;

a gate of the second P-MOSFET is coupled to a gate of the second N-MOSFET; and a source of the first N-MOSFET is coupled to a source of the second N-MOSFET;

third and fourth P-MOSFETs;

third and fourth N-MOSFETs, wherein:

a drain of the third P-MOSFET is coupled to a drain of the third N-MOSFET;

a drain of the fourth P-MOSFET is coupled to a drain of the fourth N-MOSFET;

a gate of the third P-MOSFET is coupled to a gate of the third N-MOSFET;

a gate of the fourth P-MOSFET is coupled to a gate of the fourth N-MOSFET;

a source of the third N-MOSFET is coupled to a source of the fourth N-MOSFET;

the drain of the first P-MOSFET is coupled to the drain of the third P-MOSFET and is coupled to the gate of the fourth P-MOSFET; and the drain of the second P-MOSFET is coupled to the drain of the fourth N-MOSFET and is coupled to the gate of the third P-MOSFET;

fifth and sixth P-MOSFETs;

fifth and sixth N-MOSFETs, wherein:

a drain of the fifth P-MOSFET is coupled to a drain of the fifth N-MOSFET;

a drain of the sixth P-MOSFET is coupled to a drain of the sixth N-MOSFET;

a gate of the fifth P-MOSFET is coupled to a gate of the fifth N-MOSFET;

a gate of the sixth P-MOSFET is coupled to a gate of the sixth N-MOSFET;

a source of the fifth N-MOSFET is coupled to a source of the sixth N-MOSFET;

the drain of the third P-MOSFET is coupled to the coupled gates of the fifth P-MOSFET and the fifth N-MOSFET; and the drain of the fourth P-MOSFET is coupled to the coupled gates of the sixth P-MOSFET and the sixth N-MOSFET;

seventh and eighth P-MOSFETs; and seventh and eighth N-MOSFETs, wherein:

a drain of the seventh P-MOSFET is coupled to a drain of the seventh N-MOSFET;

a drain of the eighth P-MOSFET is coupled to a drain of the eighth N-MOSFET;

a gate of the seventh P-MOSFET is coupled to a gate of the seventh N-MOSFET;

a gate of the eighth P-MOSFET is coupled to a gate of the eighth N-MOSFET;

a source of the seventh N-MOSFET is coupled to a source of the eighth N-MOSFET;

the drain of the fifth P-MOSFET is coupled to the drain of the seventh P-MOSFET and is coupled to the gate of the eighth P-MOSFET; and the drain of the sixth P-MOSFET is coupled to the drain of the eighth N-MOSFET and is coupled to the gate of the seventh P-MOSFET; and wherein:

the sources of each of the first P-MOSFET, the second P-MOSFET, the third P-MOSFET, fourth P-MOSFET, the fifth P-MOSFET, the sixth P-MOSFET, seventh P-MOSFET, and the eighth P-MOSFET are all directly connected to a power supply voltage.

2. The circuitry of claim 1, wherein:

the circuitry is implemented within a laptop computer, a cell phone, or a personal digital assistant.

3. The circuitry of claim 1, wherein:

the circuitry includes three active circuitry element levels stacked between the power supply voltage and a ground voltage level.

4. The circuitry of claim 1, further comprising:

a ninth N-MOSFET whose drain is coupled to the coupled sources of the first and second N-MOSFETs and whose source is grounded;

a tenth N-MOSFET whose drain is coupled to the coupled sources of the third and fourth N-MOSFETs and whose source is grounded;

a eleventh N-MOSFET whose drain is coupled to the coupled sources of the fifth and sixth N-MOSFETs and whose source is grounded; and a twelfth N-MOSFET whose drain is coupled to the coupled sources of the seventh and eighth N-MOSFETs and whose source is grounded.

5. The circuitry of claim 1, wherein:

the circuitry is implemented within a router, a switch, a bridge, a modem, or a system controller.

6. The circuitry of claim 1, further comprising:

a ninth N-MOSFET whose drain is coupled to the coupled sources of the first and second N-MOSFETs and whose source is grounded;

a tenth N-MOSFET whose drain is coupled to the coupled sources of the third and fourth N-MOSFETs and whose source is grounded;

an eleventh N-MOSFET whose drain is coupled to the coupled sources of the fifth and sixth N-MOSFETs and whose source is grounded;

a twelfth N-MOSFET whose drain is coupled to the coupled sources of the seventh and eighth N-MOSFETs and whose source is grounded; and the circuitry includes three active circuitry element levels stacked between the power supply voltage and ground.

7. The circuitry of claim 1, further comprising:

a ninth N-MOSFET whose drain is coupled to the coupled sources of the first and second N-MOSFETs and whose source is grounded;

a tenth N-MOSFET whose drain is coupled to the coupled sources of the third and fourth N-MOSFETs and whose source is grounded;

a eleventh N-MOSFET whose drain is coupled to the coupled sources of the fifth and sixth N-MOSFETs and whose source is grounded;

a twelfth N-MOSFET whose drain is coupled to the coupled sources of the seventh and eighth N-MOSFETs and whose source is grounded;

the circuitry includes three active circuitry element levels stacked between the power supply voltage and ground;

a first of the three active circuitry element levels includes the first P-MOSFET, the second P-MOSFET, the third P-MOSFET, fourth P-MOSFET, the fifth P-MOSFET, the sixth P-MOSFET, seventh P-MOSFET, and the eighth P-MOSFET;

a second of the three active circuitry element levels includes the first N-MOSFET, the second N-MOSFET, the third N-MOSFET, fourth N-MOSFET, the fifth N-MOSFET, the sixth N-MOSFET, seventh N-MOSFET, and the eighth N-MOSFET; and a third of the three active circuitry element levels includes the ninth N-MOSFET, the tenth N-MOSFET, the eleventh N-MOSFET, and the twelfth N-MOSFET.

8. The circuitry of claim 1, wherein:

the circuitry is implemented within a phase locked loop (PLL).

9. The circuitry of claim 1, wherein:

the circuitry is an integrated circuit.

10. The circuitry of claim 1, wherein:

the circuitry is implemented within a wireless communication device.

* * * * *